United States Patent
Ebbecke et al.

(10) Patent No.: US 9,653,646 B2
(45) Date of Patent: May 16, 2017

(54) SEMICONDUCTOR LAYER SEQUENCE AND METHOD OF PRODUCING THE SAME

(71) Applicant: OSRAM Opto Semiconductors GmbH, Regensburg (DE)

(72) Inventors: Jens Ebbecke, Rohr in Niederbayem (DE); Claudia Kauss, Obertraubling (DE); Petrus Sundgren, Lappersdorf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/034,565

(22) PCT Filed: Nov. 4, 2014

(86) PCT No.: PCT/EP2014/073717
§ 371 (c)(1),
(2) Date: May 5, 2016

(87) PCT Pub. No.: WO2015/071134
PCT Pub. Date: May 21, 2015

(65) Prior Publication Data
US 2016/0276531 A1  Sep. 22, 2016

(30) Foreign Application Priority Data
Nov. 13, 2013  (DE) .................. 10 2013 112 490

(51) Int. Cl.
*H01L 33/02* (2010.01)
*H01L 33/08* (2010.01)
(Continued)

(52) U.S. Cl.
CPC .......... *H01L 33/08* (2013.01); *H01L 33/0062* (2013.01); *H01L 33/025* (2013.01); *H01L 33/06* (2013.01); *H01L 33/30* (2013.01)

(58) Field of Classification Search
CPC ..................................... H01L 33/025
See application file for complete search history.

(56) References Cited

U.S. PATENT DOCUMENTS

| 6,060,727 A | 5/2000 | Shakuda | |
| 2009/0267098 A1* | 10/2009 | Choi | H01L 33/20 257/98 |

(Continued)

FOREIGN PATENT DOCUMENTS

| EP | 2 403 019 A2 | 1/2012 |
| WO | 02/03479 A1 | 1/2002 |

*Primary Examiner* — Daniel Whalen
(74) *Attorney, Agent, or Firm* — DLA Piper LLP (US)

(57) ABSTRACT

A semiconductor layer sequence includes an n-conducting n-type side, a p-conducting p-type side, and an active zone between the sides, the active zone simultaneously generating a first radiation having a first wavelength and a second radiation having a second wavelength, the active zone including at least one radiation-active layer having a first material composition that generates the first radiation, the at least one radiation-active layer is oriented perpendicular to a growth direction of the semiconductor layer sequence, the active zone includes a multiplicity of radiation-active tubes having a second material composition and/or having a crystal structure that generates the second radiation, which crystal structure deviates from the at least one radiation-active layer, and the radiation-active tubes are oriented parallel to the growth direction, the radiation-active tubes having an average diameter of 5 nm to 100 nm and an average surface density of the radiation-active tubes of $10^8$ $1/cm^2$ to $10^{11}$ $1/cm^2$.

11 Claims, 2 Drawing Sheets

(51) Int. Cl.
*H01L 33/00* (2010.01)
*H01L 33/06* (2010.01)
*H01L 33/30* (2010.01)

(56) References Cited

U.S. PATENT DOCUMENTS

| | | |
|---|---|---|
| 2010/0148147 A1 | 6/2010 | Bour et al. |
| 2011/0140128 A1 | 6/2011 | Leatherdale et al. |
| 2011/0156088 A1 | 6/2011 | Moon et al. |
| 2011/0316004 A1* | 12/2011 | Yoon .................. H01L 21/0237 257/79 |
| 2012/0168753 A1* | 7/2012 | Sanga .................... H01L 33/02 257/52 |
| 2014/0183594 A1* | 7/2014 | Loffler ................. H01L 33/025 257/103 |

\* cited by examiner

SEMICONDUCTOR LAYER SEQUENCE AND METHOD OF PRODUCING THE SAME

TECHNICAL FIELD

This disclosure relates to a semiconductor layer sequence for an optoelectronic semiconductor chip and a method of producing such a semiconductor layer sequence.

BACKGROUND

It could be helpful to provide a semiconductor layer sequence that generates radiation in two mutually different wavelength ranges.

SUMMARY

We provide a semiconductor layer sequence for an optoelectronic semiconductor chip including an n-conducting n-type side, a p-conducting p-type side, and an active zone situated between the n-type side and the p-type side, the active zone being simultaneously generating a first radiation having a first wavelength and a second radiation having a second wavelength, wherein the active zone includes at least one radiation-active layer having a first material composition that generates the first radiation, the at least one radiation-active layer is oriented perpendicular to a growth direction of the semiconductor layer sequence, the active zone includes a multiplicity of radiation-action tubes having a second material composition and/or having a crystal structure that generates the second radiation, which crystal structure deviates from the at least one radiation-active layer, and the radiation-active tubes are oriented parallel to the growth direction, the radiation-active tubes having an average diameter of 5 nm to 100 nm and an average surface density of the radiation-active tubes of $10^8$ 1/cm$^2$ to $10^{11}$ 1/cm$^2$.

We also provide a method of producing the semiconductor layer sequence for an optoelectronic semiconductor chip including an n-conducting n-type side, a p-conducting p-type side, and an active zone situated between the n-type side and the p-type side, the active zone being simultaneously generating a first radiation having a first wavelength and a second radiation having a second wavelength, wherein the active zone includes at least one radiation-active layer having a first material composition that generates the first radiation, the at least one radiation-active layer is oriented perpendicular to a growth direction of the semiconductor layer sequence, the active zone includes a multiplicity of radiation-action tubes having a second material composition and/or having a crystal structure that generates the second radiation, which crystal structure deviates from the at least one radiation-active layer, and the radiation-active tubes are oriented parallel to the growth direction, the radiation-active tubes having an average diameter of 5 nm to 100 nm and an average surface density of the radiation-active tubes of $10^8$ 1/cm$^2$ to $10^{11}$ 1/cm$^2$, including providing at least one growth substrate for the semiconductor layer sequence, providing a defect source and/or producing defects, and growing the semiconductor layer sequence onto the growth substrate by epitaxy, wherein defects are produced at a main side of the growth substrate before the process of growing the semiconductor layer sequence, the defects are formed by at least one of cutouts and elevations at the growth substrate, and each of the cutouts and/or elevations is provided for exactly one of the radiation-active tubes.

LIST OF REFERENCE SIGNS

Figure 1:
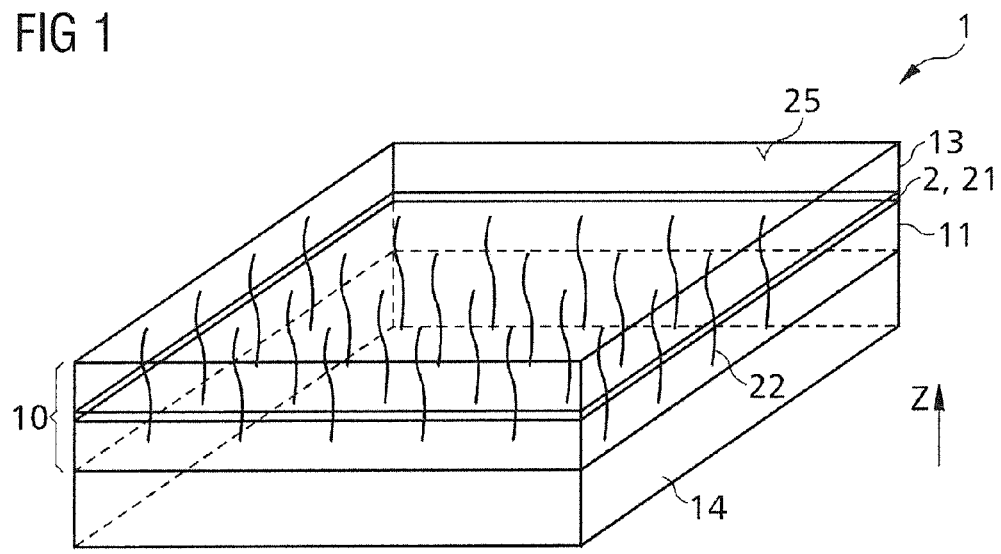
FIGS. 1 and 2 show schematic illustrations of examples of semiconductor layer sequences described herein.

1 Optoelectronic semiconductor chip
10 Semiconductor layer sequence
11 n-type side
13 p-type side
14 Growth substrate
15 Buffer layer
16 n-type cladding layer
17 p-type cladding layer
18 Contact layer
19 Intermediate layer
2 Active zone
21 Radiation-active layer
22 Radiation-active tube
23 Barrier layer
25 Radiation main side
3 Defect source
40 Main side of the growth substrate
5 Metallization
I Intensity in arbitrary units (a.u.)
L1 First radiation having the first wavelength
L2 Second radiation having the second wavelength
λ Wavelength in nm
z Growth direction

DETAILED DESCRIPTION

Our semiconductor layer sequence may be used for an optoelectronic semiconductor chip. By way of example, the semiconductor layer sequence is a radiation-active layer sequence that can also be referred to as a radiation-active structure, in particular for a light emitting diode, LED for short, or for a laser diode, LD for short.

The semiconductor layer sequence is preferably based on a III-V compound semiconductor material. The semiconductor material is, for example, a nitride compound semiconductor material such as $Al_nIn_{1-n-m}Ga_mP$ or a phosphide compound semiconductor material such as $Al_nIn_{1-n-m}Ga_mP$, or else an arsenide compound semiconductor material such as $Al_nIn_{1-n-m}Ga_mAs$, wherein in each case 0≤n≤1, 0≤m≤1 and n+m≤1. In this case, the semiconductor layer sequence can comprise dopants and additional constituents. For the sake of simplicity, however, only the essential constituents of the crystal lattice of the semiconductor layer sequence, that is to say Al, As, Ga, In, N or P, are indicated, even if they can be replaced and/or supplemented in part by small amounts of further substances.

The semiconductor layer sequence may comprise an n-conducting n-type side. The n-type side comprises one or, preferably, a plurality of layers of the semiconductor layer sequence.

The semiconductor layer sequence may comprise a p-conducting p-type side. The p-type side, too, can be constructed from one or from a plurality of layers of the semiconductor layer sequence.

The semiconductor layer sequence may comprise at least one active zone. The active zone is situated between the n-type side and the p-type side. The active zone simultaneously generates a first radiation having a first wavelength and a second radiation having a second wavelength. Here and hereafter, wavelength of the corresponding radiation denotes the wavelength of an emission band at which a highest photometric power is present. This wavelength is also referred to as peak wavelength.

The active zone may comprise one or, preferably, a plurality of radiation-active layers. The at least one radiation-active layer is preferably a so-called quantum well or potential well, in particular as a two-dimensional quantum well or potential well. The at least one radiation-active layer has a first material composition. If a plurality of radiation-active layers are present, then preferably all of the radiation-active layers have the same material composition within the scope of the production tolerances. As an alternative thereto, it is possible for different radiation-active layers to be fashioned with a purposefully different material composition.

The at least one radiation-active layer may generate the first radiation. If a plurality of radiation-active layers having different material compositions are present, then the respective layers can emit radiation having different wavelengths and a comparatively large spectral width of the first radiation is achievable. In other words, the radiations of all the radiation-active layers are then encompassed by the term first radiation.

The at least one radiation-active layer may be oriented perpendicular or approximately perpendicular to a growth direction of the semiconductor layer sequence. In other words, the growth direction forms a perpendicular to the at least one radiation-active layer.

The semiconductor layer sequence and/or the active zone may include a multiplicity of radiation-active tubes that can also be referred to as wires. The radiation-active tubes can have a second material composition and/or a different lattice structure from the radiation-active layer. The second material composition of the radiation-active tubes is different from the first material composition of the at least one radiation-active layer. The radiation-active tubes generate the second radiation. The tubes may be, in particular, one-dimensional quantum wells.

The radiation-active tubes may be oriented parallel or substantially parallel to the growth direction. Substantially parallel means, for example, an average deviation with respect to the growth direction of at most 5° or of at most 2°. Within the scope of the production tolerances, the radiation-active tubes can have, in a sectional view perpendicular to the growth direction, an identical material composition or else different material compositions. It is possible for a material composition of the radiation-active tubes to change along the growth direction.

The semiconductor layer sequence for an optoelectronic semiconductor chip may comprise an n-conducting n-type side, a p-conducting p-type side and an active zone situated therebetween. The active zone may simultaneously generate a first radiation having a first wavelength and a second radiation having a second wavelength, wherein the first wavelength differs from the second wavelength. The active zone comprises at least one radiation-active layer having a first material composition that generates the first radiation. The at least one radiation-active layer is oriented perpendicular to a growth direction of the semiconductor layer sequence. Furthermore, the active zone comprises a multiplicity of radiation-active tubes having a second material composition generating the second radiation, wherein the second material composition is different from the first material composition. The radiation-active tubes are oriented parallel to the growth direction.

In contrast to the radiation from thermal light sources, for example, sunlight, a spectral emission from light emitting diodes, is generally spectrally narrowband. In association therewith, the light from light emitting diodes generally has a comparatively low color rendering index. However, a high color rendering index and a possibility of realistically rendering objects illuminated with the radiation with regard to their color impression are desired for many applications. In the semiconductor layer sequence described here, an active zone comprises two structures, a two-dimensional quantum well structure in the form of the at least one radiation-active layer and a one-dimensional or else a zero-dimensional quantum well structure in the form of the radiation-active tubes. These structures have mutually different emission wavelengths. A color rendering index of a radiation generated by the semiconductor layer sequence can be increased as a result.

Another possibility of realizing semiconductor layer sequences exhibiting multicolored emission consists in combining two-dimensional quantum wells or well structures having different band gaps in the semiconductor layer sequence. However, charge carrier tapping and reabsorption are then dominated by the quantum wells exhibiting long-wave emission such that an emission is virtually single-colored again and dominated by the long-wave emission. These disadvantages are overcome when two-dimensional quantum wells are combined with lower-dimensional quantum wells. Differently dimensional structures are energized identically on account of their spatially separate position. Moreover, reabsorption in the lower-dimensional structures is greatly suppressed on account of their smaller volume. It is thus possible to construct a semiconductor layer sequence which can efficiently emit a plurality of colors simultaneously.

The semiconductor layer sequence, in particular the entire semiconductor layer sequence, may be based on the material system InAlGaP/AlGaAs. In other words, the main components of the semiconductor layer sequence are then In, Al, Ga, P and/or As. Further constituents are preferably present only in concentrations within the scope of a doping.

The radiation-active tubes or at least one portion of the radiation-active tubes may extend from the n-type side right into the p-type side. In other words, the radiation-active tubes penetrate through the active zone completely in a direction parallel to the growth direction.

The at least one radiation-active layer may be formed from $In_xAl_yGa_{1-x-y}P$. It holds true here that $0.40 \leq x$ or $0.45 \leq x$ or $0.50 \leq x$. Alternatively or additionally it holds true that $x \leq 0.58$ or $x \leq 0.65$ or $x \leq 0.72$. Furthermore it preferably holds true that $0 \leq y$ or $0.05 \leq y$ or $0.1 \leq y$ or $0.2 \leq y$ and/or $y \leq 0.3$ or $y \leq 0.4$ or $y \leq 0.5$.

The radiation-active tubes may be formed from $In_aAl_bGa_{1-a-b}P$. In this case, it preferably holds true that $0.2 \leq a$ or $0.5 \leq a$ or $0.55 \leq a$. Alternatively or additionally, it holds true that $a \leq 0.6$ or $a \leq 0.7$ or $a \leq 0.8$. Moreover, it preferably holds true that $0 \leq b$ or $0.025 \leq b$ or $0.05 \leq b$ or $0.1 \leq b$ and/or $b \leq 0.25$ or $b \leq 0.35$ or $b \leq 0.45$ or $b \leq 0.8$.

It may hold true that $a > x$. In particular, it holds true that $a - x \leq 0.02$ or $a - x \geq 0.04$ or $a - x \geq 0.08$.

The radiation-active tubes may have an average diameter of at least 1 nm or 5 nm or 10 nm. Alternatively or additionally, an average diameter of the radiation-active tubes is at most 150 nm or 100 nm or 70 nm. In other words, the average diameter is very small compared to lateral dimensions of the semiconductor layer sequence. The lateral dimension of the semiconductor layer sequence is, for example, at least 100 µm or 250 µm or 500 µm.

The radiation-active tubes may have an average surface density of at least $10^7$ 1/cm$^2$ or $10^8$ 1/cm$^2$ or $10^9$ 1/cm$^2$. Alternatively or additionally, the average surface density of the radiation-active tubes, as seen in plan view, is at most $10^{12}$ 1/cm$^2$ or $10^{11}$ 1/cm$^2$ or $1^{10}$ 1/cm$^2$.

An average thickness of the at least one radiation-active layer may be at least 2 m or 3 nm or 4.5 nm. Alternatively or additionally, the average thickness is at most 15 nm or 12 nm or 9 nm. In other words, it is possible for an average diameter of the radiation-active tubes to be of the same order of magnitude as an average thickness of the radiation-active layer. The expression of the same order of magnitude can mean that the average thickness differs from the average diameter by at most a factor of 5 or 2.

The first wavelength may be at least 570 nm or 580 nm and/or at most 605 nm or 595 nm. In other words, the first wavelength then lies in the yellow and/or orange spectral range. As an alternative thereto, it is also possible for the first wavelength to lie, for example, in the blue spectral range at at least 420 nm or 440 nm or 460 nm and/or at most 490 nm or 480 nm or 470 nm. The first wavelength can likewise lie in the green spectral range, for example, at at least 515 nm or 525 nm and/or at at most 555 nm or 545 nm.

The second wavelength may lie in the red spectral range, for example, at at least 610 nm or 620 nm and/or at at most 700 nm or 680 nm or 660 nm. If the first wavelength lies in the blue spectral range, then the second wavelength can also lie in the green or yellow-orange spectral range.

A difference between the first and second wavelengths may be at least 25 nm or 40 nm or 55 nm. Alternatively or additionally, the difference is at most 150 nm or 120 nm or 80 nm.

The second wavelength may be at longer wavelengths than the first wavelength. In other words the radiation-active tubes then have a smaller band gap than the at least one radiation-active layer. On account of the small volume of the radiation-active tubes, an absorption of radiation having the first wavelength in the radiation-active tubes is greatly reduced.

We also provide a method of producing a semiconductor layer sequence, in particular a semiconductor layer sequence according to at least one of the above examples. Therefore, features of the method are also disclosed for the semiconductor layer sequence, and vice versa.

The method comprises the following steps, preferably in the order indicated:
  providing at least one growth substrate for the semiconductor layer sequence,
  providing a defect source and/or producing defects, and
  growing the semiconductor layer sequence onto the growth substrate by epitaxy.

The method can comprise further steps of completing an optoelectronic semiconductor chip, for instance fitting electrical contact layers, metallizations and/or passivation layers, and singulation. It is possible for the growth substrate to not be removed from the semiconductor layer sequence and remain in the finished produced optoelectronic semiconductor chip. Alternatively, the growth substrate can also be replaced by a carrier substrate.

The at least one growth substrate may be fitted on a main side of a substrate carrier during the process of growing the semiconductor layer sequence.

The defect source may be formed by a prestructuring of the growth substrate. In particular, the prestructuring can be carried out before the growth of the semiconductor layer sequence for instance with the aid of photolithography, electron beam lithography or interference lithography, preferably followed by a wet-chemical or dry-chemical etching process, or else by deposition of defects or by damaging the growth substrate by electron radiation or ion radiation.

The defect source may be a source of condensation nuclei of materials used for the epitaxy. By way of example, impurities can be purposefully added to an epitaxy reactor, a condensation or reaction of precursor molecules in particular for metal organic vapor phase epitaxy, MOVCD for short, taking place at the impurities. Such condensation nuclei can make it possible that imperfections or defects are produced in the semiconductor layer sequence during the process of growing the semiconductor layer sequence on the growth substrate. Proceeding from the defects in the semiconductor layer sequence, it is then possible for the radiation-active tubes to grow.

The defect source may be active and/or present only at the beginning of the growth of the semiconductor layer sequence. By way of example, the defect source no longer produces defects before the active zone or a layer onto which the active zone is grown directly is grown.

The average surface density of the radiation-active tubes may be settable by way of the number of defects produced or added by the defect source in particular at the beginning of the growth of the semiconductor layer sequence. In this case, it is not necessary for there to be a linear relationship between the average surface density of the radiation-active tubes and the number of defects.

The tubes may begin directly at the growth substrate or at and/or in a buffer layer. The buffer layer is, in particular, a layer of the semiconductor layer sequence that directly adjoins the growth substrate. By way of example, lattice matching or extensive lattice matching of materials of the growth substrate and of the semiconductor layer sequence, in particular for the active zone, is achievable by the buffer layer.

The tubes may be radiation-active only in the active zone. In other words, an emission of the second radiation is then carried out only in the active zone. In this case, the active zone extends, for example, perpendicular to the growth direction and includes, in particular, regions lying between a first and last radiation-active layer along the growth direction. As an alternative thereto, it is possible for the radiation-active tubes to emit the second radiation also in regions outside the active zone.

The growth substrate may be a GaAs substrate. Preferably, the buffer layer is grown directly onto the growth substrate, the buffer layer being formed from InGaAlP, for example.

The buffer layer may be succeeded by an n-type cladding layer. By way of example, the n-type cladding layer is formed from InAlP. In particular, the active zone is applied to the n-type cladding layer directly or indirectly.

The active zone may comprise a plurality of the radiation-active layers, for example, at least 2 or 10 or at least 20 and/or at most 250 or 150 or 100 or 75. In this case, barrier layers are respectively situated between adjacent radiation-active layers. By way of example, the barrier layers are formed from InAlGaP. Preferably, within the scope of the production tolerances, all of the radiation-active layers have identical material compositions and layer thicknesses, in the same way as this can hold true for the barrier layers.

The active zone may be succeeded by a p-type cladding layer along the growth direction. The p-type cladding layer is formed from p-doped InGaAlP, for example.

A contact layer may be applied to the p-type cladding layer directly or indirectly. The contact layer can be shaped from InGaAlP.

A semiconductor layer sequence described here and a method described here are explained in greater detail below on the basis of examples with reference to the drawings. In this case, identical reference signs indicate identical elements in the individual figures. In this case, however, relations to scale are not illustrated. Rather, individual elements may be illustrated with an exaggerated size to afford a better understanding.

FIG. 1 shows an optoelectronic semiconductor chip 1 in a perspective illustration. A semiconductor layer sequence 10 is grown on a growth substrate 14. The semiconductor layer sequence 10 comprises an n-type side 11 and a p-type side 13. An active zone 2 is situated between the n-type side 11 and the p-type side 13, the active zone including at least one radiation-active layer 21. A radiation main side 25 of the semiconductor chip 1 faces away from the growth substrate 14.

Furthermore, the semiconductor layer sequence 10 includes a multiplicity of radiation-active tubes 22. The tubes 22 are oriented parallel to a growth direction z of the semiconductor layer sequence 10. In this case, the tubes 22 can have a slightly meandering course and a main extension direction of the tubes 22 can deviate slightly from the growth direction z. The tubes 22 penetrate completely through the active zone 2.

Figure 2:
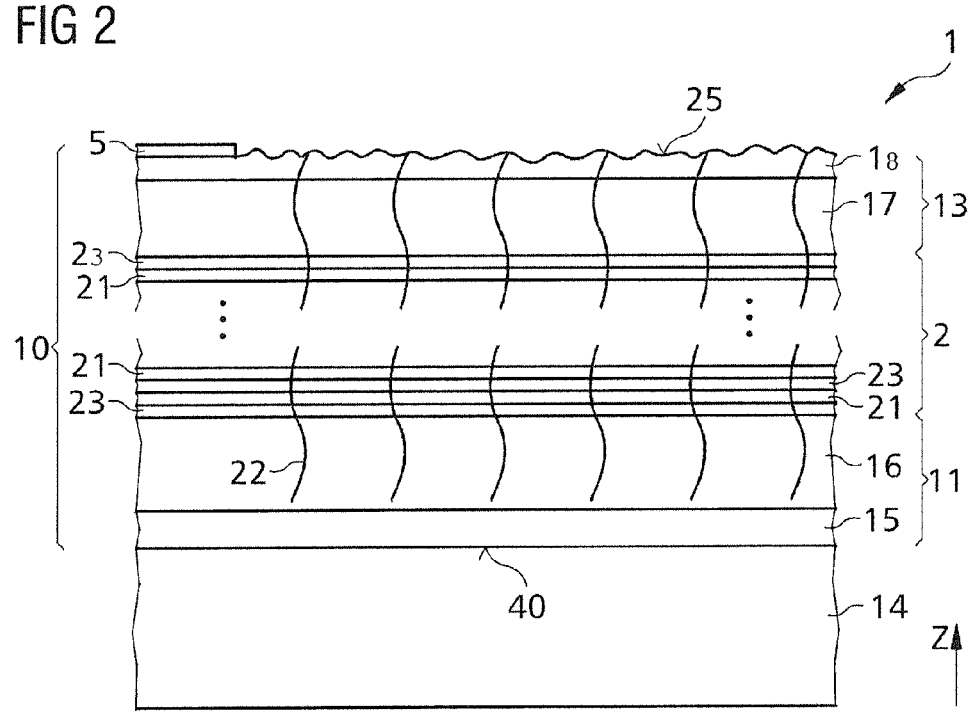

FIG. 2 shows a further example of a semiconductor chip 1 in a schematic sectional illustration. By way of example, the semiconductor layer sequence 10 is based on the material system InAlGaP/InAlGaAs.

The semiconductor chip 1 comprises a GaAs substrate as a growth substrate 14. A buffer layer 15 is deposited on a main side 40 of the growth substrate 14. A thickness of the buffer layer 15 is 500 nm, for example. The buffer layer 15 is shaped from GaAs, for example.

The buffer layer 15 is succeeded by an n-type cladding layer 16. The thickness of the n-type cladding layer is 3 μm, for example. The n-type cladding layer 16 can be based on InAlP. The layers 15, 16 form the n-type side 11.

The active zone 2 is grown onto the n-type side 11. The active zone 2 comprises a multiplicity of alternating radiation-active layers 21 and barrier layers 23. The radiation-active layers 21 are quantum wells and shaped from AlInGaP, for example. The thickness of the radiation-active layers 21 is 6 nm, for example. The barrier layers 23 are likewise shaped from AlInGaP and can likewise have a thickness of 6 nm.

The active zone 2 is succeeded by a p-type cladding layer 17. The p-type cladding layer 17 has a thickness of 1.7 μm, for instance. The p-type cladding layer is shaped from InGaAlP for instance.

The p-type cladding layer 17 is succeeded by a contact layer 18. The thickness of the contact layer 18 is 250 nm, for example. The layers 17, 18 form the p-type side 13. A roughening to improve a coupling-out of radiation is optionally shaped at the p-type side 13 and/or at the radiation main side 25. Alternatively or additionally, it is possible for such a roughening to be fashioned at a side of the growth substrate 14 facing away from the semiconductor layer sequence 10.

A metallization 5 that energizes the semiconductor layer sequence 10 can be situated at the radiation main side 25. Moreover, electrical contact structures such as bond pads, current spreading layers or conductor tracks are not depicted, for the sake of simplifying the illustration.

In particular proceeding from the buffer layer 15, the tubes 22 extend continuously right into the p-type side 13, for example, right up to or right into the contact layer 18. The tubes 22 originate, for example, in defects at the growth substrate 14 or in the buffer layer 15. The tubes 22 can therefore begin directly at a main side 40 of the growth substrate 14 or only at a distance from the main side 40 in the semiconductor layer sequence 10, in particular in the buffer layer 15. Consequently, the tubes 22 grow with a different material composition than the radiation-active layers 21. On account of the different material composition, the tubes 22 emit in a different spectral range. The tubes 22 can be regarded as one-dimensional structures. An average diameter of the tubes 22 is, for example, at most 100 nm or 50 nm or 25 nm.

The thicknesses for the respective layers mentioned in association with FIG. 2 hold true, for example, with a deviation of at most a factor of 2 or 1.5. The illustrated layers can succeed one another directly. Alternatively, further intermediate layers (not depicted) can also be present. In FIG. 2, the n-type side 11 is situated nearer to the growth substrate 14 than the p-type side 13. As also in all the other examples, the p-type side 13 can also be situated nearer to the growth substrate 14 than the n-type side 11. The construction of the semiconductor layer sequence 10 should be correspondingly adapted in this case.

Figure 3:
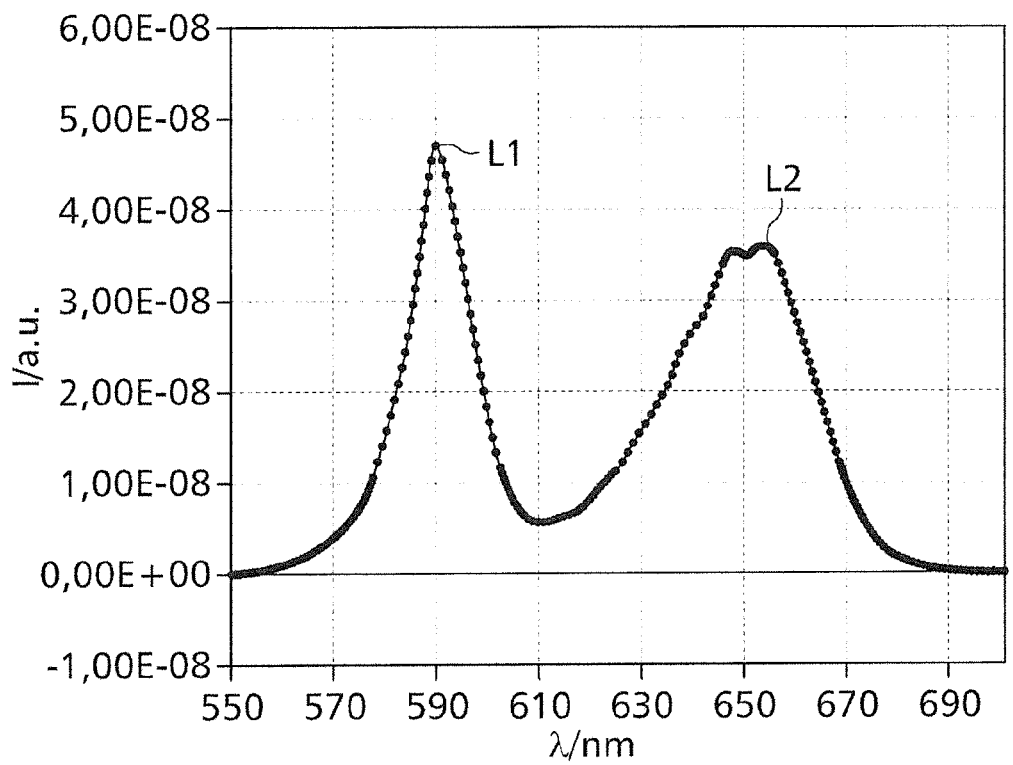
FIG. 3 shows an illustration of an emission spectrum of a semiconductor layer sequence described herein.

FIG. 3 shows an emission spectrum of a semiconductor layer sequence, for example, as illustrated in association with FIG. 2. A wavelength λ in nanometers is plotted against an intensity in arbitrary units, a.u. for short.

The radiation-active layers 21 emit a first radiation at a first wavelength L1 in the yellow-orange spectral range. The first wavelength L1 is approximately 590 nm. A second radiation having a second wavelength L2 is emitted in the radiation-active tubes 22. The second wavelength L2 is approximately 650 nm. In particular a color rendering index of the radiation generated by the semiconductor chips 1 can be increased as a result of the two-colored emission of the semiconductor layer sequence 10.

In contrast to the illustration in FIG. 3, it is also possible for the semiconductor layer sequence to be based on AlInGaN, for instance, such that the first wavelength is approximately 470 nm, for example, and the second wavelength is approximately 570 nm in the yellow spectral range, for example.

The material compositions of the tubes 22 and the radiation-active layers 21 can be set by the growth conditions. By way of example, the indium content, crucial in particular for the emission wavelength, is settable by a growth temperature and by an amount of added precursor for indium.

Figure 4:
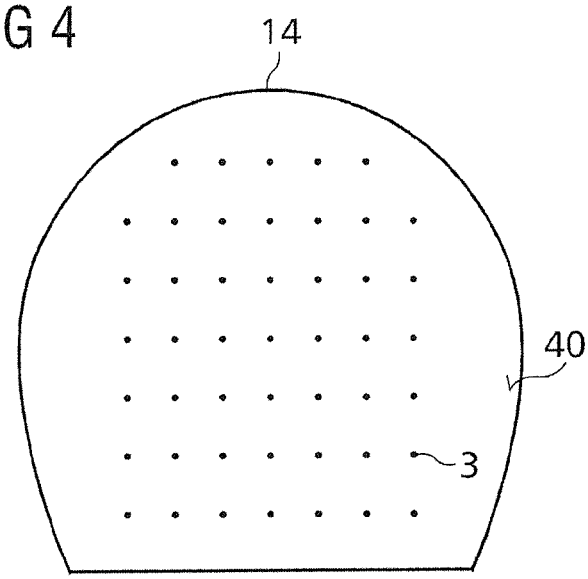
FIG. 4 shows a schematic illustration of a method of producing a semiconductor layer sequence.

FIG. 4 schematically illustrates a structured growth substrate 14 for a production method for a semiconductor layer sequence 10. Defects 3 are exposed at the growth substrate 14 at the beginning of the epitaxial growth of the semiconductor layer sequence 10. The defects 3 are produced by a structuring of the main side 40 of the growth substrate 14. The defects 3 are produced, for example, by material removal, in particular by etching. The defects 3 are then holes or cutouts in the growth substrate 14.

The defects 3 can likewise be produced by a material deposition on the main side 40. In this case, the defects are formed by elevations or islands on the main side 40. The defects 3 then comprise a different material than the growth substrate 14. In particular metals such as gold or semiconductor materials such as InAs are appropriate as materials.

Preferably exactly one of the radiation-active tubes 22 is formed per defect 3, within the scope of the production tolerances. The density of the defects 3 on the main side 40 thus approximately corresponds to a density of the radiation-active tubes 22 in the finished grown semiconductor layer sequence 10.

The defects 3 have, for example, an average diameter, as seen in a plan view of the main side 40, of at least 0.25 nm or 1 nm or 5 nm and/or at most 100 nm or 25 nm or 10 nm. An average extent of the defects 3 in a direction perpendicular to the main side 40 is, for example, at least 0.25 nm or 1 nm or 3 nm or 5 nm and/or at most 500 nm or 100 nm or 25 nm or 10 nm. The stated values apply both to elevations and to cutouts. The defects 3 can be produced in a self-assembled manner, for example, by the application of a thin material layer and by subsequent island formation by heating, or else purposefully in regular fashion, for instance by photolithography or electron beam writing.

The sequences and methods described here are not restricted by the description on the basis of the examples. Rather, this disclosure encompasses any novel feature and also any combination of features, which in particular includes any combination of features in the appended claims, even if the feature or combination itself is not explicitly specified in the claims or examples.

This application claims priority of DE 10 2013 112 490.9, the subject matter of which is incorporated herein by reference.

The invention claimed is:

1. A semiconductor layer sequence for an optoelectronic semiconductor chip comprising:
    an n-conducting n-type side,
    a p-conducting p-type side, and
    an active zone situated between the n-type side and the p-type side, the active zone being simultaneously generating a first radiation having a first wavelength and a second radiation having a second wavelength,
    wherein
    the active zone comprises at least one radiation-active layer having a first material composition that generates the first radiation,
    the at least one radiation-active layer is oriented perpendicular to a growth direction of the semiconductor layer sequence,
    the active zone comprises a multiplicity of radiation-active tubes having a second material composition and/or having a crystal structure that generates the second radiation, which crystal structure deviates from the at least one radiation-active layer, and
    the radiation-active tubes are oriented parallel to the growth direction, the radiation-active tubes having an average diameter of 5 nm to 100 nm and an average surface density of the radiation-active tubes of $10^8$ 1/cm$^2$ to $10^{11}$ 1/cm$^2$.

2. The semiconductor layer sequence according to claim 1,
    wherein the semiconductor layer sequence is based on the material system InAlGaP or AlGaAs, and
    at least one portion of the radiation-active tubes extends from the n-type side right into the p-type side or vice versa and completely penetrates through the active zone.

3. The semiconductor layer sequence according to claim 1,
    wherein the at least one radiation-active layer is formed from In$_x$Al$_y$Ga$_{1-x-y}$P where 0.45≤x≤0.65 and where 0.05≤y≤0.4, and
    the radiation-active tubes are formed from In$_a$Al$_b$Ga$_{1-a-b}$P where 0.2≤a≤0.7 and where 0.025≤b≤0.8 and a−x≥0.04.

4. The semiconductor layer sequence according to claim 1, wherein an average thickness of the at least one radiation-active layer is 3 nm to 12 nm.

5. The semiconductor layer sequence according to claim 1, wherein the first wavelength is 570 nm to 605 nm and the second wavelength is 620 nm to 680 nm and a difference between the wavelengths is at least 25 nm and at most 120 nm.

6. A method of producing a semiconductor layer sequence according to claim 1 comprising:
    providing at least one growth substrate for the semiconductor layer sequence,
    providing a defect source and/or producing defects, and
    growing the semiconductor layer sequence onto the growth substrate by epitaxy,
    wherein defects are produced at a main side of the growth substrate before the process of growing the semiconductor layer sequence,
    the defects are formed by at least one of cutouts and elevations at the growth substrate, and
    each of the cutouts and/or elevations is provided for exactly one of the radiation-active tubes.

7. The method according to claim 6, wherein the defects are produced in a self-assembled manner by application of a thin material layer onto the substrate and subsequent island formation by heating.

8. The method according to claim 6,
    wherein the defects are produced by photolithography or electron beam writing,
    the defects have an average diameter as seen in a plan view of at least 1 nm and at most 25 nm, and
    an average height of the defects is at least 1 nm and at most 100 nm.

9. The method according to claim 6,
    wherein the tubes grow beginning directly at the growth substrate, and
    the tubes are radiation-active only in the active zone.

10. The method according to claim 6,
    wherein the tubes grow beginning in a buffer layer at a distance from the growth substrate, and
    the tubes are radiation-active only in the active zone.

11. The method according to claim 6, wherein
    the growth substrate is a GaAs substrate, and
    the active zone comprises 20 to 100 of the radiation-active layers and includes barrier layers composed of InAlGaP arranged therebetween.

* * * * *